(12) United States Patent
Tanaka et al.

(10) Patent No.: US 12,101,889 B2
(45) Date of Patent: Sep. 24, 2024

(54) TAPE GUIDE AND COMPONENT SUPPLYING EQUIPMENT

(71) Applicant: FUJI CORPORATION, Chiryu (JP)

(72) Inventors: Keita Tanaka, Takahama (JP); Kenichi Hayashi, Ichinomiya (JP)

(73) Assignee: FUJI CORPORATION, Chiryu (JP)

( * ) Notice: Subject to any disclaimer, the term of this patent is extended or adjusted under 35 U.S.C. 154(b) by 253 days.

(21) Appl. No.: 17/759,105

(22) PCT Filed: Feb. 6, 2020

(86) PCT No.: PCT/JP2020/004583
§ 371 (c)(1),
(2) Date: Jul. 20, 2022

(87) PCT Pub. No.: WO2021/157014
PCT Pub. Date: Aug. 12, 2021

(65) Prior Publication Data
US 2023/0044719 A1 Feb. 9, 2023

(51) Int. Cl.
*H05K 13/00* (2006.01)
*H05K 13/02* (2006.01)
*H05K 13/04* (2006.01)

(52) U.S. Cl.
CPC ....... *H05K 13/0419* (2018.08); *H05K 13/021* (2013.01)

(58) Field of Classification Search
CPC .. H05K 13/0419; H05K 13/021; H05K 13/02; H05K 13/0417
See application file for complete search history.

(56) References Cited

U.S. PATENT DOCUMENTS

| 10,390,469 | B2* | 8/2019 | Tanaka | H05K 13/02 |
| 2018/0007820 | A1* | 1/2018 | Murase | H05K 13/0419 |

(Continued)

FOREIGN PATENT DOCUMENTS

| EP | 1530414 A1 * | 5/2005 | ......... H05K 13/0419 |
| EP | 2211600 A2 * | 7/2010 | ......... H05K 13/0419 |

(Continued)

OTHER PUBLICATIONS

International Search Report Issued Apr. 28, 2020, in PCT/JP2020/004583, filed on Feb. 6, 2020, therein, 2 pages.

*Primary Examiner* — Emmanuel M Marcelo

(74) *Attorney, Agent, or Firm* — Oblon, McClelland, Maier & Neustadt, L.L.P.

(57) ABSTRACT

A tape guide includes a guide section configured to guide a carrier tape, a component exposing section configured to open a cover tape to expose an electronic component in a component storage section during conveyance of the carrier tape guided by the guide section, a tongue portion provided on the component exposing section and configured such that a distal end portion is movable between a first height position at which the distal end portion enters between a base tape and the cover tape and a second height position higher than the first height position, a pressing section placed above the tongue portion to apply a pressing force to the tongue portion to cause the tongue portion to move downward, and a stepped portion provided on a facing surface on which the tongue portion and the pressing section face each other.

5 Claims, 6 Drawing Sheets

(56) References Cited

U.S. PATENT DOCUMENTS

2018/0249605 A1* 8/2018 Tanaka ............... H05K 13/0419
2021/0153397 A1* 5/2021 Ohashi ............... H05K 13/0882

FOREIGN PATENT DOCUMENTS

| JP | 2007510296 A | * | 4/2007 | ............. H05K 13/02 |
| JP | 2013150020 A | * | 8/2013 | ......... H05K 13/0419 |
| JP | 2016-26415 A | | 2/2016 | |
| WO | WO-2016117091 A1 | * | 7/2016 | ............. B32B 38/10 |
| WO | WO-2021014503 A1 | * | 1/2021 | ............. H05K 13/02 |
| WO | WO-2021033245 A1 | * | 2/2021 | |

* cited by examiner

TAPE GUIDE AND COMPONENT SUPPLYING EQUIPMENT

TECHNICAL FIELD

The present specification relates to a tape guide and a component supply device.

BACKGROUND ART

Conventionally, a tape guide incorporated in a component supply device is known (for example, refer to Patent Literature 1). The component supply device supplies an electronic component to a component supply position in a state where the electronic component is stored in a component storage section of a carrier tape. The carrier tape has a base tape provided with the component storage section, and a cover tape peelably attached to the base tape to close the component storage section of the base tape.

The tape guide has a guide section extending along a conveyance direction of the carrier tape, and a component exposing section that peels (that is, releases) the cover tape from the base tape to expose electronic components in the component storage section. The guide section has an upper wall portion for guiding an upper surface of the carrier tape and a side wall portion for guiding a side surface of the carrier tape. The component exposing section has a tongue portion extending in the conveyance direction and a blade portion for cutting the cover tape. The tongue portion is fixed to the guide section by welding or the like. The tongue portion is placed so that a distal end portion thereof is fixed at a height position where the tongue portion is inserted between the base tape and the cover tape of the carrier tape guided by the guide section. When the tongue portion is inserted between the base tape and the cover tape, the cover tape is then guided to the blade portion. The blade portion cuts and divides the cover tape. During conveyance of the carrier tape guided by the guide section, the tongue portion of the component exposing section is inserted between the base tape and the cover tape, and the blade portion thereof cuts and divides the cover tape to partially peel the cover tape from the base tape, thereby exposing the electronic component in the component storage section.

PATENT LITERATURE

Patent Literature 1: JP-A-2016-26415

BRIEF SUMMARY

Technical Problem

However, in the tape guide described in Patent Literature 1, as described above, the tongue portion is fixed to the guide section, and the distal end portion of the tongue portion is fixed at a height position (first height position) at which the tongue portion is inserted between the base tape and the cover tape of the carrier tape. Therefore, since a state in which the distal end portion of the tongue portion comes into contact with the upper surface of the base tape is maintained after the distal end portion of the tongue portion enters between the base tape and the cover tape at a distal end of the carrier tape in the conveyance direction and the peeling of the cover tape is started, the electronic component in the component storage section of the base tape comes into easy contact with a corner portion of the distal end portion of the tongue portion.

Meanwhile, in order to prevent the electronic component in the component storage section of the base tape from coming into contact with the corner portion of the distal end portion of the tongue portion, a structure for fixing the distal end portion of the tongue portion at a position (second height position) higher than the first height position may be considered. However, according to this structure, at the time of starting the peeling of the cover tape, the distal end portion of the tongue portion cannot enter between the base tape and the cover tape at the distal end of the carrier tape in the conveyance direction, and thus, it is difficult to appropriately peel the cover tape from the base tape, and consequently, it may be difficult to appropriately expose the electronic component in the component storage section of the base tape.

Therefore, in order to appropriately start the peeling of the cover tape and prevent the distal end portion of the tongue portion from coming into contact with the electronic components in the component storage section of the base tape after the peeling, it is conceivable to adopt a configuration in which the distal end portion of the tongue portion can be moved between the first height position and the second height position. In this structure movable up and down, it is suitable to provide a stopper section in order to restrain the distal end portion of the tongue portion from moving downward to a height lower than the first height position. For example, when the stopper section is an upper surface of a side wall portion constituting the tape guide, an abutment portion at which the tongue portion abuts on the stopper section is limited to a region of an end portion of the tongue portion in a width direction.

However, in this abutment limiting structure, when the upper surface portion at which the tongue portion is pressed downward by a pressing operation of a worker is a position (specifically, a region of the center portion in the width direction or the end portion in the width direction not facing the stopper section) deviated from the end portion of the tongue portion in the width direction facing the stopper section, until the tongue portion abuts on the stopper section or even after the tongue portion abuts on the stopper section again, a situation may occur in which the distal end portion moves downward while being twisted in a tape width direction with an abutting surface as a fulcrum. When the situation occurs, the distal end portion of the tongue portion cannot enter the space between the base tape and the cover tape in a horizontal state, and thus, the height of the distal end portion of the tongue portion may be further lowered than a desired height position by the pressing operation of the worker. Therefore, there is a concern that the distal end portion of the tongue portion cannot appropriately enter between the base tape and the cover tape at the distal end of the carrier tape in the conveyance direction.

An object of the present specification is to provide a tape guide and a component supply device capable of moving a distal end portion of a tongue portion of a component exposing section up and down while maintaining an appropriate posture of the distal end portion.

Solution to Problem

According to the present specification, there is provided a tape guide including: a guide section extending along a conveyance direction in which a carrier tape is conveyed and configured to guide the carrier tape, the carrier tape including a base tape provided with a component storage section for storing an electronic component and a cover tape provided on a surface of the base tape to close the component storage section; a component exposing section configured to open the cover tape to expose the electronic component in the component storage section during conveyance of the carrier tape guided by the guide section; a tongue portion provided on the component exposing section and configured such that a distal end portion is movable between a first height position at which the distal end portion can enter between the base tape and the cover tape and a second height position higher than the first height position; a stopper section configured to restrain the distal end portion from moving to a height lower than the first height position; a pressing section placed above the tongue portion to apply a pressing force to the tongue portion to cause the tongue portion to move downward; and a stepped portion provided on a facing surface on which the tongue portion and the pressing section face each other and including a step formed thereon, in which the stepped portion includes a protruding portion including a contact portion in which contact is generated between the tongue portion and the pressing section when the pressing force is applied, and a recessed portion in which the contact is not generated even when the pressing force is applied, and the contact portion is located in an upper region of a lower surface of the tongue portion with respect to an abutment portion at which the tongue portion abuts on the stopper section.

According to the present disclosure, when the distal end portion of the tongue portion is lowered to the first height position by the pressing force caused by the pressing section, the distal end portion of the tongue portion can enter between the base tape and the cover tape at the distal end of the carrier tape in the conveyance direction. In addition, when the distal end portion of the tongue portion returns to the second height position higher than the first height position by the release of the pressing force caused by the pressing section, the electronic component in the component storage section of the base tape is prevented from coming into contact with the distal end portion of the tongue portion during the conveyance of the carrier tape after the distal end portion of the tongue portion enters between the base tape and the cover tape described above.

Further, when the pressing force caused by the pressing section is applied to the tongue portion, the contact between the tongue portion and the pressing section occurs at the contact portion of the protruding portion of the stepped portion, whereas the contact does not occur at the recessed portion of the stepped portion. The contact portion of the stepped portion is located in an upper region with respect to an abutment portion of the lower surface of the tongue portion where the tongue portion abuts on the stopper section. In this structure, the pressing force applied to the tongue portion from the pressing section is acted on a position in the upper region with respect to the abutment portion of the lower surface of the tongue portion at which the tongue portion abuts the stopper section. Therefore, since it is possible to prevent the tongue portion from being twisted until the lower surface of the tongue portion abuts on the stopper section during the pressing operation of the worker or from being further twisted after the tongue portion abuts on the stopper section, it is possible to move the distal end portion of the tongue portion up and down while maintaining an appropriate posture of the distal end portion.

DESCRIPTION OF EMBODIMENTS

1. Configuration of Component Supply Device Including Tape Guide

Figure 1:
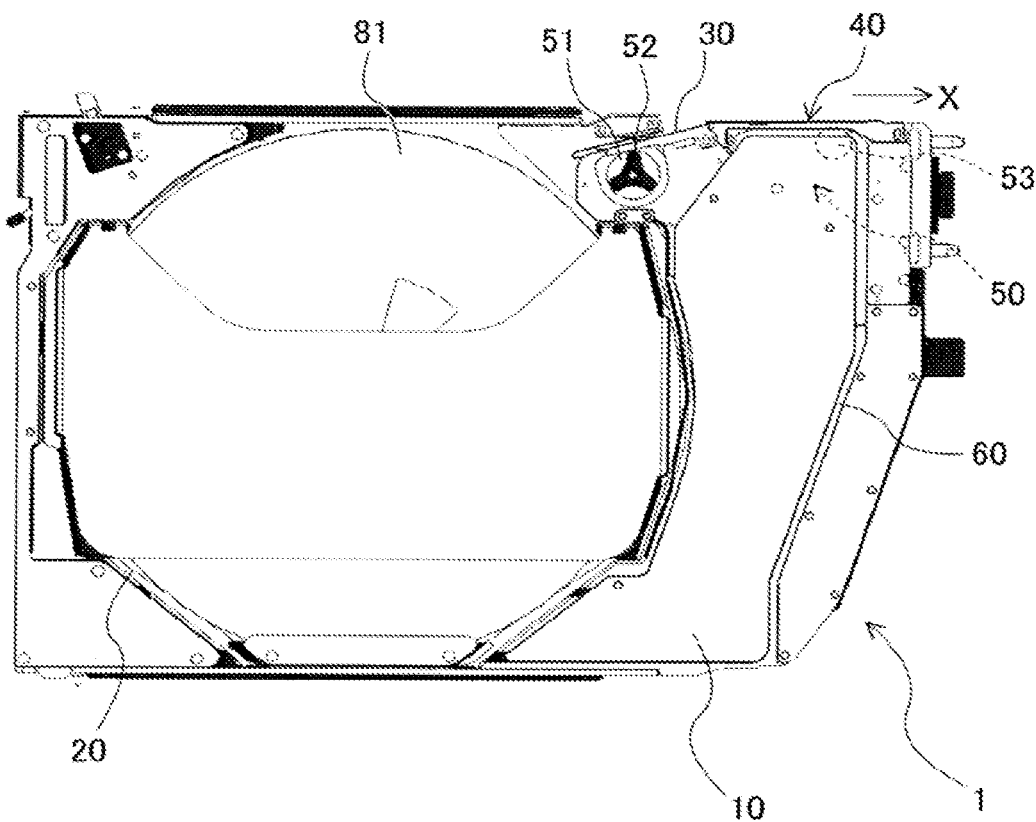
FIG. 1 is a configuration view of a component supply device including a tape guide according to one embodiment.

A configuration of component supply device 1 according to one embodiment will be described. Component supply device 1 is, for example, a cassette type tape feeder incorporated in a component mounter. The component mounter is a device which is provided on a board production line and mounts electronic component 2 on a substrate. Component supply device 1 is a device which supplies electronic component 2 to be mounted on the substrate to component supply position P for transferring electronic component 2 to the substrate. As illustrated in FIG. 1, component supply device 1 includes cassette case 10, tape loading section 20, tape conveyance path 30, tape guide 40, tape feeding section 50, and tape discharge passage 60.

Figure 2:
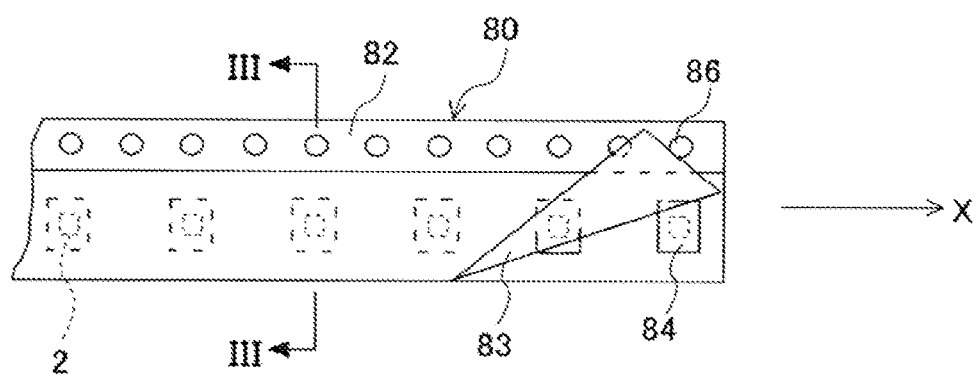
FIG. 2 is a top view of a carrier tape.
Figure 3:
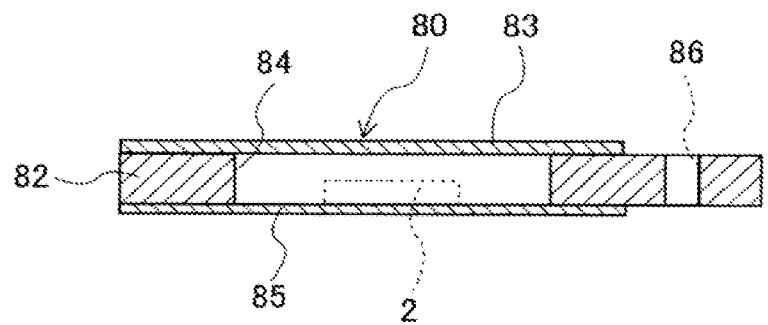
FIG. 3 is a sectional view taken along line of the carrier tape illustrated in FIG. 2.

Cassette case 10 is a case formed in a thin rectangular shape by a transparent or opaque plastic plate or a metal plate. Cassette case 10 has a cover that can be opened and closed on a side surface portion. Tape loading section 20 is a section for detachably loading tape reel 81 around which carrier tape 80 illustrated in FIG. 2 and FIG. 3 is wound. Tape loading section 20 is provided in cassette case 10. Tape loading section 20 rotatably holds tape reel 81 in cassette case 10. Tape reel 81 is attached to and detached from tape loading section 20 in a state where the cover of cassette case 10 is opened.

Carrier tape 80 is a tape member formed in an elongated shape. Carrier tape 80 has a predetermined width dimension (that is, a tape width) in a tape width direction. Generally, a tape width of carrier tape 80 differs depending on a type of carrier tape 80 or a size of electronic component 2 to be accommodated, and is determined in advance as a standard. The tape width is, for example, 4 mm, 8 mm, 12 mm, 16 mm, 24 mm, or the like. Electronic component 2 is a component such as a transistor, a diode, or a resistor constituting an electronic circuit. Electronic component 2 may include, for example, a micro component having a size of 0201 (0.2 mm×0.1 mm).

As illustrated in FIG. 2 and FIG. 3, carrier tape 80 has base tape 82 and cover tape 83. Base tape 82 is formed of a flexible material such as a paper material or a resin. Base tape 82 has component storage section (that is, a cavity) 84. Component storage section 84 is a hole or a groove for storing electronic component 2 to be mounted on the substrate by the component mounter. Carrier tape 80 may be an embossed tape in which component storage section 84 of base tape 82 protrudes downward, or may be a paper tape in which groove-shaped component storage section 84 is provided on a surface.

Component storage section 84 is provided approximately at a center of base tape 82 in the tape width direction. Multiple component storage sections 84 are provided along a tape longitudinal direction, and are placed in a row at predetermined intervals. As illustrated in FIG. 3, when component storage section 84 is a hole that penetrates base tape 82, in order to prevent electronic component 2 from falling off, bottom tape 85 that closes a bottom portion of component storage section 84 further adheres to a lower surface of base tape 82. Bottom tape 85 may be formed of a transparent or translucent paper material, a polymer film, or the like.

Base tape 82 also has feed hole 86. Feed hole 86 is a through hole provided to convey carrier tape 80 in the tape longitudinal direction. Feed hole 86 is an engagement hole for engaging an engagement protrusion of a sprocket described later. Feed hole 86 is formed in a substantially circular shape or an elliptical shape. Feed hole 86 is provided at one end portion of base tape 82 in the tape width direction. Multiple feed holes 86 are provided in the tape longitudinal direction, and are placed in a row at predetermined intervals. Component storage section 84 and feed hole 86 are placed in two rows in the tape width direction and placed along the tape longitudinal direction.

Cover tape 83 is a tape that peelably adheres to a surface (upper surface) of base tape 82. Cover tape 83 is placed so as to close and cover component storage section 84 on the surface of base tape 82. Cover tape 83 adheres to each of both end portions in the tape width direction excluding a center portion in the tape width direction where component storage section 84 is provided with respect to the surface of base tape 82. Cover tape 83 has a function of preventing electronic component 2 stored in component storage section 84 from protruding to the outside. Cover tape 83 is formed of a transparent polymer film.

Cover tape 83 may have a tape width substantially the same as a tape width of base tape 82, or may have a tape width smaller than the tape width of base tape 82, for example, as illustrated in FIG. 3, by adhering to a portion other than a portion where feed hole 86 is provided with respect to base tape 82. Tape width of cover tape 83 may vary depending on the type of carrier tape 80, that is, the tape width of base tape 82.

Tape conveyance path 30 is a conveyance path through which carrier tape 80 drawn from tape reel 81 loaded in tape loading section 20 in cassette case 10 is conveyed toward component supply position P. Tape conveyance path 30 is provided in cassette case 10. Tape conveyance path 30 extends linearly from an outlet of carrier tape 80 in tape reel 81 toward component supply position P. Tape conveyance path 30 abuts on and supports a lower surface of carrier tape 80. Tape conveyance path 30 is inclined so that a position thereof gradually increases from an upstream side to a downstream side of carrier tape 80 in conveyance direction (hereinafter, referred to as the tape conveyance direction) X of carrier tape 80. Tape conveyance path 30 is formed such that a most downstream portion extends horizontally.

Tape guide 40 is a member for guiding carrier tape 80 conveyed on tape conveyance path 30. Tape guide 40 is placed on a downstream side of tape conveyance path 30 in tape conveyance direction X. Tape guide 40 can press the upper surface of carrier tape 80 on tape conveyance path 30, and can peel cover tape 83 from base tape 82 of carrier tape 80 to expose electronic component 2 in component storage section 84. In particular, tape guide 40 is biased downward with respect to cassette case 10, and thus, even when a tape thickness of carrier tape 80 changes, tape guide 40 presses the upper surface of carrier tape 80 to prevent carrier tape 80 from floating up, and thus, feed hole 86 can be reliably engaged with the sprocket.

Figure 4:
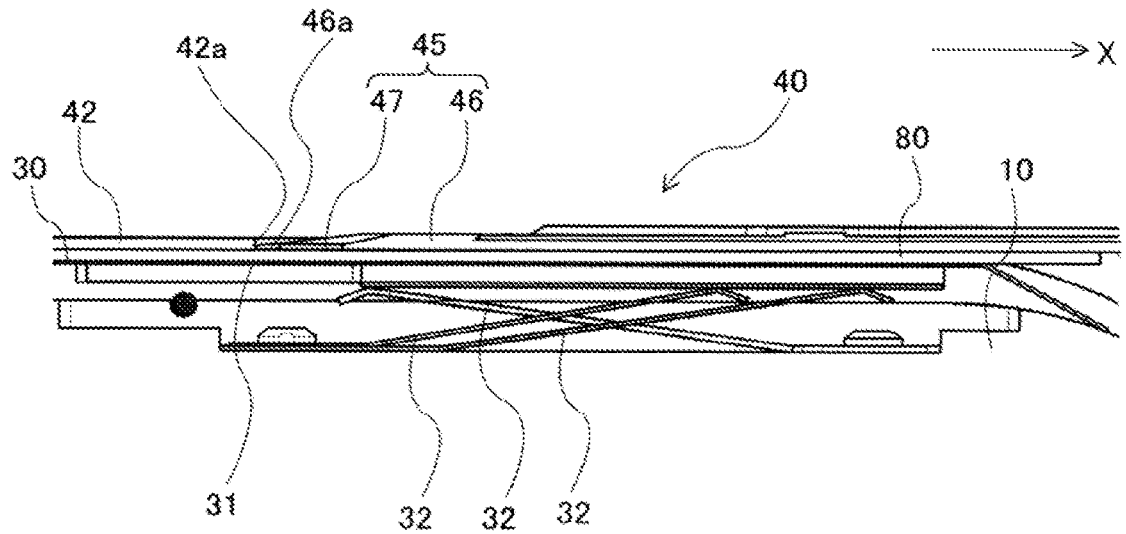
FIG. 4 is a configuration view of a main part of the component supply device including the tape guide according to one embodiment.

As illustrated in FIG. 4, backup plate spring 31 and support plate spring 32 are provided in cassette case 10. Backup plate spring 31 and support plate spring 32 are placed on a downstream side of tape conveyance path 30 in tape conveyance direction X. Backup plate spring 31 extends in tape conveyance direction X along tape conveyance path 30, and is fixed to cassette case 10 by a screw or the like at one end of the backup plate spring 31. Backup plate spring 31 supports the lower surface of carrier tape 80 (specifically, base tape 82; including base tape 82 from which cover tape 83 is peeled) on tape conveyance path 30. Backup plate spring 31 generates a biasing force that biases carrier tape 80 on tape conveyance path 30 upward to press upper surface of carrier tape 80 against upper wall portion 42 of tape guide 40, which will be described later.

Tape conveyance path 30 is provided with a groove into which component storage section 84 protruding downward in embossed carrier tape 80 can be engaged. Groove is formed in a size corresponding to embossed carrier tape 80 at which component storage section 84 is maximized. Support plate spring 32 is placed below the groove. One or more support plate springs 32 (three in FIG. 4) are provided.

Each support plate spring 32 extends in tape conveyance direction X along tape conveyance path 30, and is fixed to cassette case 10 by a screw or the like at one end of support plate spring 32. Support plate spring 32 supports a lower surface of a lower wall of component storage section 84 of carrier tape 80 when carrier tape 80 on tape conveyance path 30 is an embossed carrier tape. Support plate spring 32 generates a force for preventing the lower wall of component storage section 84 of carrier tape 80 on tape conveyance path 30 from falling by its own weight.

Figure 5:
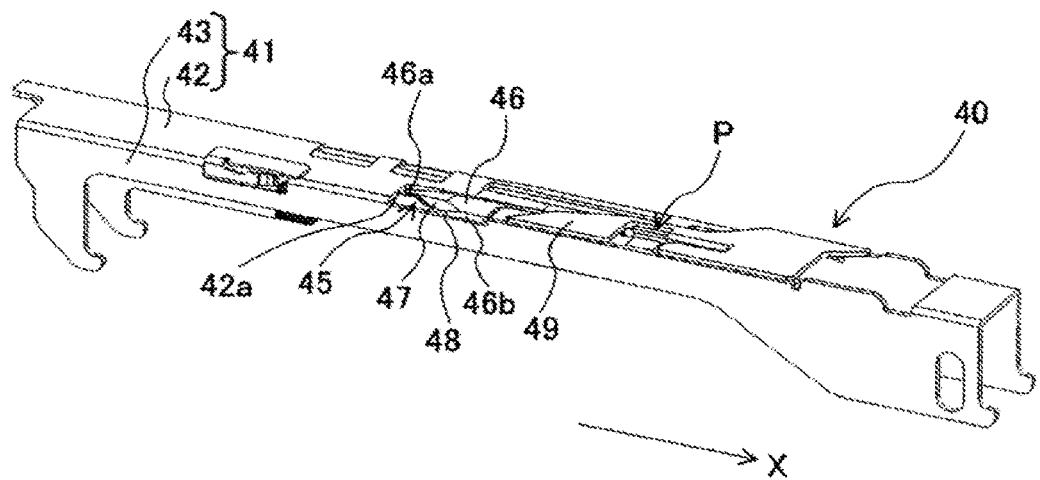
FIG. 5 is an overall perspective view of the tape guide according to one embodiment.
Figure 6:
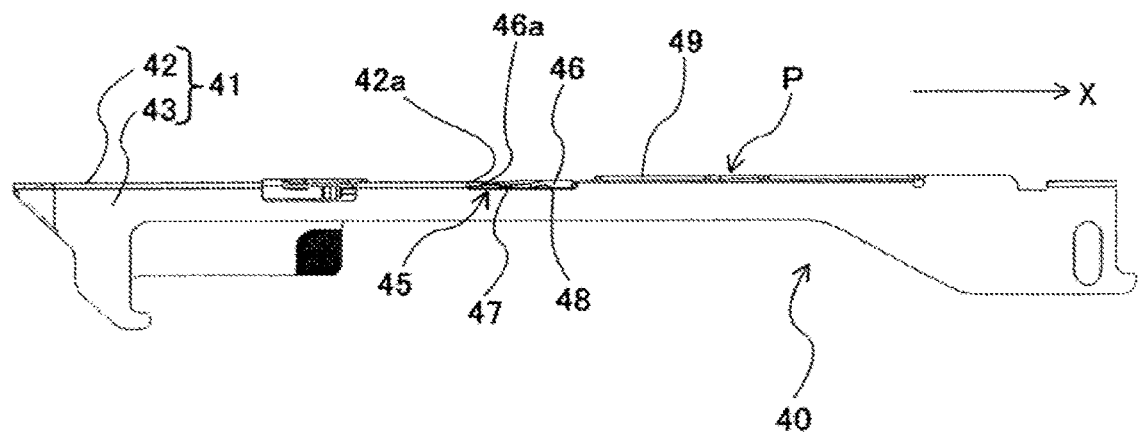
FIG. 6 is an overall side view of the tape guide according to one embodiment.
Figure 7:
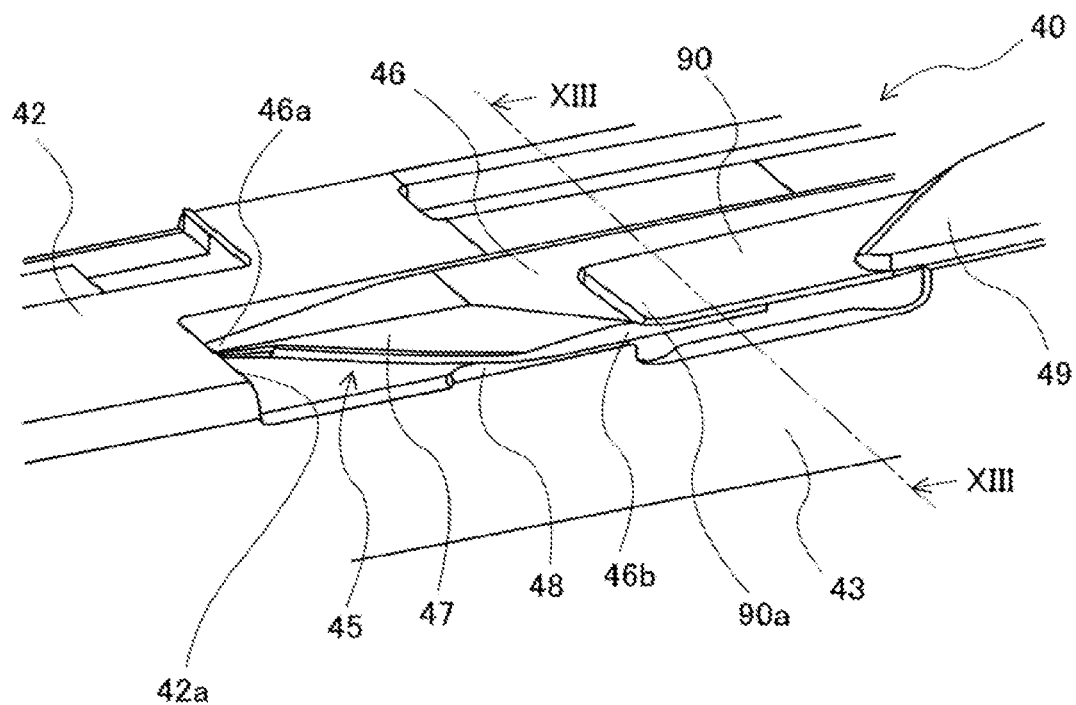
FIG. 7 is a perspective view of a main part of the tape guide according to one embodiment.
Figure 8:
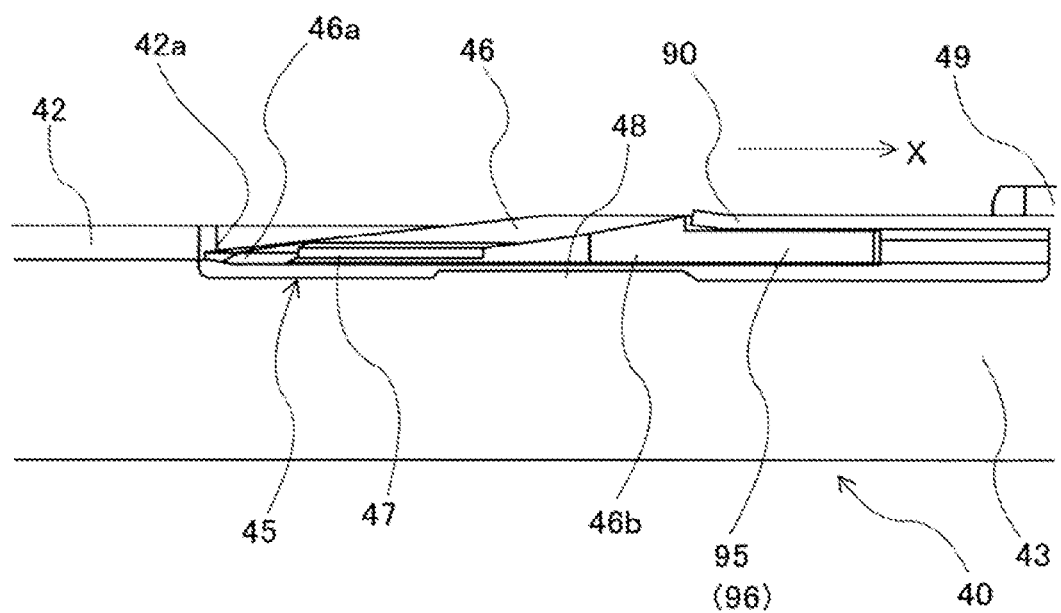
FIG. 8 is a side view of the main part of the tape guide according to one embodiment.
Figure 9:
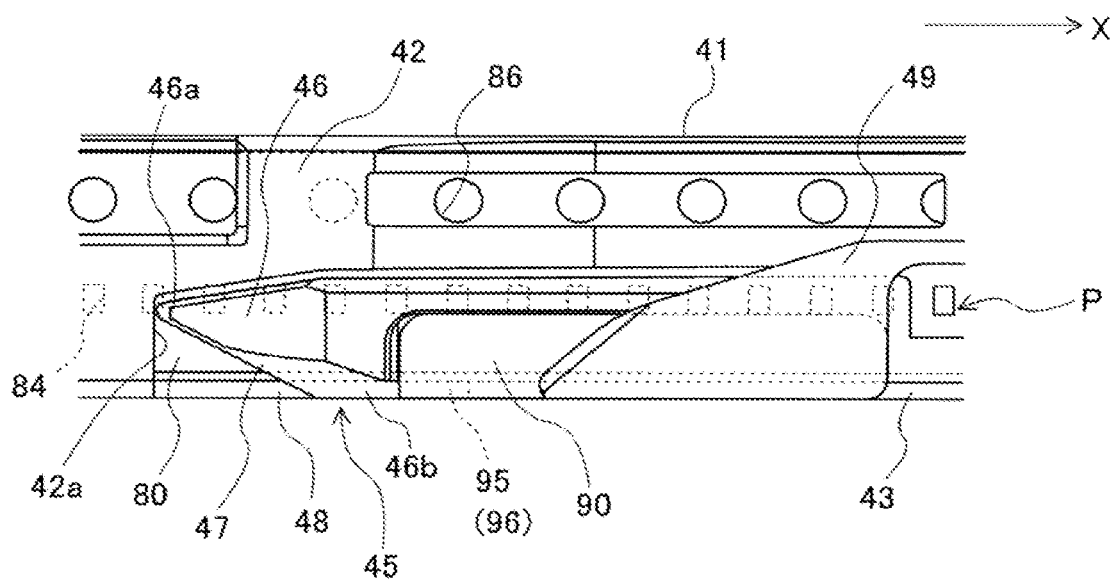
FIG. 9 is a top view of the main part of the tape guide according to one embodiment.

As illustrated in FIGS. 5 and 6, tape guide 40 has guide section 41. Guide section 41 is a section for guiding carrier tape 80. Guide section 41 extends along tape conveyance direction X and is formed in a U-shaped cross-section. Guide section 41 has upper wall portion 42 and pair of side wall portions 43. Upper wall portion 42 is a portion which is placed above tape conveyance path 30 and faces the upper surface of carrier tape 80. Upper wall portion 42 has a function of restraining an upward movement of carrier tape 80 to prevent carrier tape 80 from floating. Each of pair of side wall portions 43 is a portion which extends downward from an end portion of upper wall portion 42 in the width direction and faces a side surface of carrier tape 80.

As illustrated in FIGS. 5, 6, 7, 8, and 9, tape guide 40 has component exposing section 45. Component exposing section 45 is a portion for exposing electronic component 2 in component storage section 84 of base tape 82. Component exposing section 45 exposes electronic component 2 by peeling cover tape 83 from base tape 82 of carrier tape 80 immediately before component supply position P.

Component exposing section 45 has tongue portion 46 and blade portion 47. Tongue portion 46 is a portion inserted between base tape 82 and cover tape 83 during the conveyance of carrier tape 80. Blade portion 47 is a portion which is inserted into an adhesive portion between base tape 82 and cover tape 83, so as to partially peel cover tape 83 from base tape 82.

Opening portion 42a is formed in upper wall portion 42 of guide section 41 of tape guide 40. Opening portion 42a is formed by cutting a part of upper wall portion 42. Tongue portion 46 is placed so as to be exposed to the outside through opening portion 42a. Tongue portion 46 is formed so as to extend along tape conveyance direction X. Tongue portion 46 is formed in a plate shape, and is placed such that a plate surface is horizontal. Tongue portion 46 is fixed to guide section 41 by welding or the like at a downstream end portion in tape conveyance direction X, and is attached to guide section 41 in a cantilever structure. Tongue portion 46 is placed in a state in which distal end portion 46a is directed toward an upstream side in tape conveyance direction X.

Figure 11:
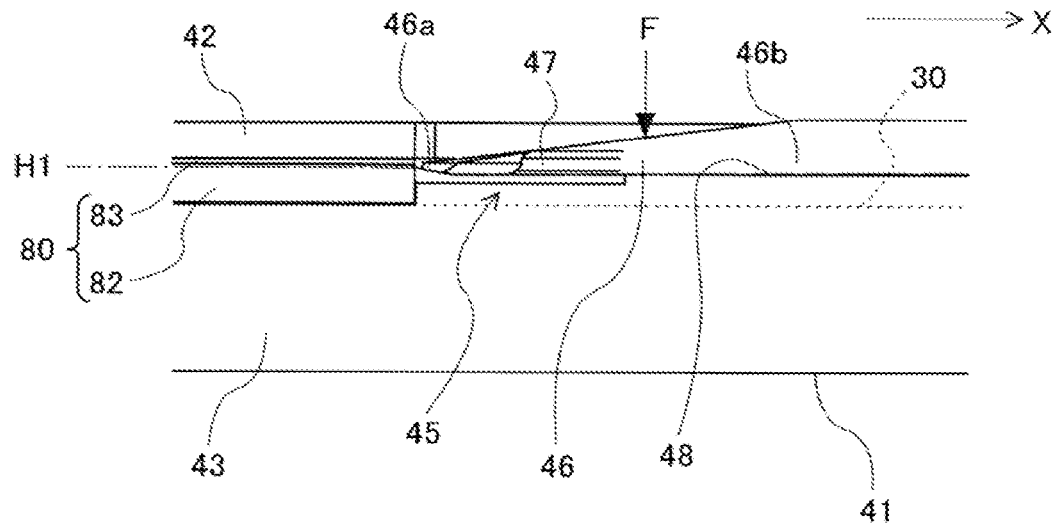
FIG. 11 is a view illustrating a state immediately before a tongue portion of a component exposing section enters between a base tape and a cover tape at a distal end of a carrier tape in a conveyance direction in the tape guide according to one embodiment.
Figure 12:
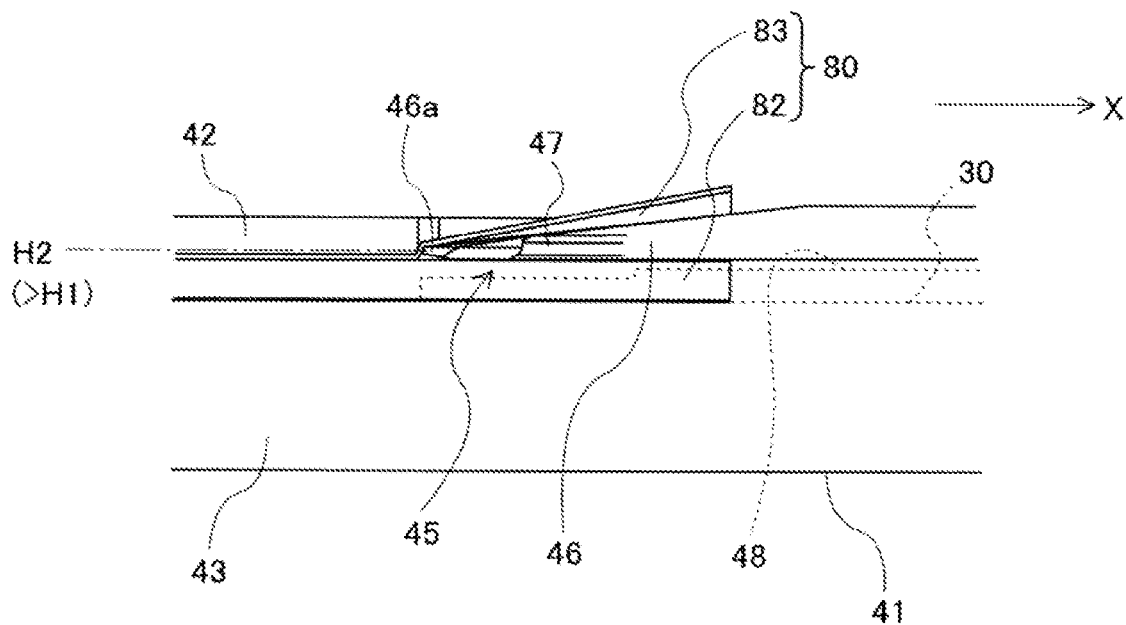
FIG. 12 is a view illustrating a state immediately after the tongue portion enters between the base tape and the cover tape at the distal end of the carrier tape in the conveyance direction in the tape guide according to an embodiment.
Figure 13:
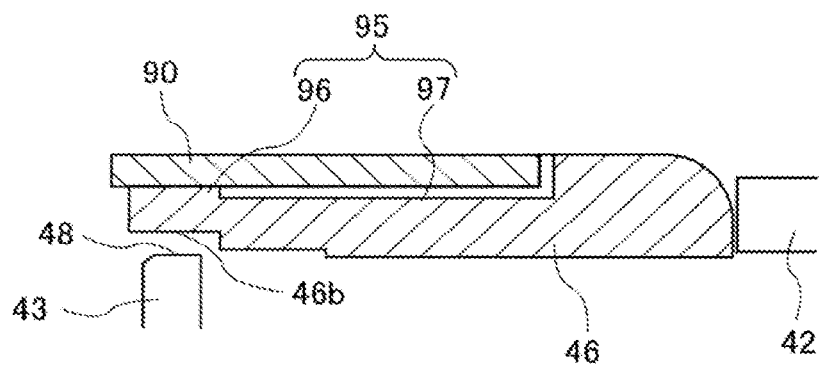
FIG. 13 is a sectional view of the tape guide in one embodiment, in which an external force is not applied to the tongue portion, taken along straight line XIII-XIII illustrated in FIG. 7.
Figure 14:
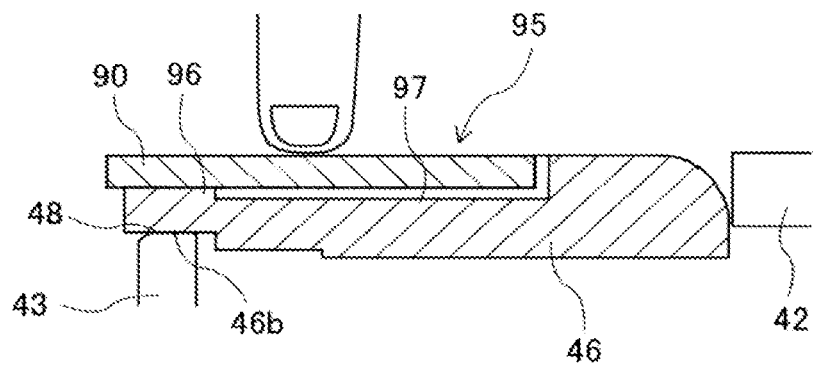
FIG. 14 is a sectional view when a tape guide, in which the external force is applied to the tongue portion in one embodiment, is cut.

Tongue portion 46 can move up and down by elastic deformation. That is, as illustrated in FIG. 11, tongue portion 46 can be elastically deformed so that distal end portion 46a is deflected downward when external force F is applied downward by the pressing through opening portion 42a by a worker (operator), and also elastically deformed so that distal end portion 46a returns to the original state when the application of external force F is released by the release of the pressing, as illustrated in FIG. 12. Tongue portion 46 is elastically deformed so that distal end portion 46a (for example, a lower surface thereof) can move between first height position H1 at which distal end portion 46a of tongue portion 46 can enter between base tape 82 and cover tape 83 of carrier tape 80 and second height position H2 higher than first height position H1.

It should be noted that first height position H1 may be any height position as long as distal end portion 46a of tongue portion 46 can enter between base tape 82 and cover tape 83 of carrier tape 80, and may be set to a height position where distal end portion 46a thereof faces a boundary between base tape 82 and cover tape 83, or may be set to a height position where distal end portion 46a thereof faces base tape 82 below the boundary. Second height position H2 is preferably set higher than first height position H1 and higher than the upper surface of base tape 82 of carrier tape 80. Further, first height position H1 and second height position H2 may be set with reference to the height position of the distal end portion in tape conveyance direction X of carrier tape 80 conveyed on tape conveyance path 30 and guided by upper wall portion 42 of guide section 41.

Tongue portion 46 has a predetermined length from a fixed portion fixed to guide section 41 to distal end portion 46a. The predetermined length is set to a length by which distal end portion 46a of tongue portion 46 can move in an up-down direction by a difference between first height position H1 and second height position H2. Tongue portion 46 is elastically deformed with the fixed portion as a fulcrum such that distal end portion 46a of tongue portion 46 is located at first height position H1 when external force F is applied to tongue portion 46 from the upper side to the lower side, and distal end portion 46a of tongue portion 46 is located at second height position H2 when the application of external force F is released. It should be noted that external force F applied to tongue portion 46 in order to cause the worker to position distal end portion 46a of tongue portion 46 at first height position H1 may be set to a force capable of positioning distal end portion 46a of tongue portion 46 at first height position H1 by a force of the worker's finger.

Tongue portion 46 has a predetermined width of carrier tape 80 in the tape width direction. The predetermined width is set so as to be smaller than the tape width of carrier tape 80. Tongue portion 46 is placed so as to be biased toward an end portion side (specifically, toward a side opposite to a side where feed hole 86 is provided) in the tape width direction of one of both end portions in the tape width direction where cover tape 83 adheres to base tape 82 in the width direction of carrier tape 80.

Tongue portion 46 is formed in a chevron shape such that a center portion in the width direction protrudes toward the upstream side in tape conveyance direction X with respect to an end portion in the width direction, and is formed so that distal end portion 46a is biased toward one end portion (specifically, an end portion in the width direction opposite to the side where feed hole 86 is provided) in the width direction. Tongue portion 46 is placed such that distal end portion 46a is located directly above component storage section 84 of base tape 82. Distal end portion 46a of tongue portion 46 is formed in a tapered shape so that a lower surface thereof is inclined downward from the upstream side in tape conveyance direction X to the downstream side in tape conveyance direction X. In order to improve entry of distal end portion 46a between base tape 82 and cover tape 83, the lower surface of distal end portion 46a may be configured to be horizontal when tongue portion 46 is pressed downward and elastically deformed so that distal end portion 46a is located at first height position H1.

Blade portion 47 is provided at any portion deviated in the width direction from the axial distal end of tongue portion 46. Blade portion 47 is provided so as to correspond to the end portion side (specifically, on the side opposite to the side where feed hole 86 is provided) in the tape width direction of one of both end portions in the tape width direction to which cover tape 83 adheres to base tape 82 of carrier tape 80. Blade portion 47 has a function of exposing electronic component 2 in component storage section 84 of base tape 82 at component supply position P. Blade portion 47 is inserted between base tape 82 and cover tape 83 at one end portion of carrier tape 80 in the tape width direction to partially peel cover tape 83 from base tape 82.

Tape guide 40 also includes stopper section 48. Stopper section 48 is a section that restrains the position movement of distal end portion 46a of tongue portion 46 to a height lower than first height position H1. Stopper section 48 is an upper surface of one side wall portion 43 of pair of side wall portions 43 of guide section 41. Stopper section 48 is provided adjacent to a portion where opening portion 42a of upper wall portion 42 is provided.

As described above, tongue portion 46 of component exposing section 45 is placed so as to be exposed to the outside through opening portion 42a. In addition, tongue portion 46 has opposing part 46b facing the upper surface of stopper section 48, that is, side wall portion 43 of guide section 41 in the up-down direction. Opposing part 46b is integrally formed with main body portion of tongue portion 46 so as to protrude from the main body portion in the tape width direction. Opposing part 46b has a function of restraining the subsequent positional movement of distal end portion 46a to a height lower than first height position H1 by abutting on stopper section 48 when tongue portion 46 is elastically deformed by the application of an external force and distal end portion 46a reaches first height position H1.

Tape guide 40 also has pressing section 90. Pressing section 90 is a section for applying a pressing force to tongue portion 46 to move tongue portion 46 downward when the worker moves tongue portion 46 downward so that distal end portion 46a of tongue portion 46 is located at first height position H1. Pressing section 90 is placed above tongue portion 46. A lower surface of pressing section 90 faces the upper surface of tongue portion 46. Pressing section 90 is placed so as to be exposed to the outside through opening portion 42a.

Pressing section 90 is integrally formed with guide section 41 of tape guide 40 or fixed to guide section 41. Pressing section 90 is formed so as to extend from a main body portion of guide section 41 in tape conveyance direction X. Pressing section 90 is formed in a flat plate shape, and is placed such that a plate surface is horizontal. Pressing section 90 is in a cantilevered state with respect to a main body portion of guide section 41, and is placed in a state in which distal end portion 90a thereof is directed toward the upstream side in tape conveyance direction X.

Pressing section 90 can move up and down by elastic deformation. Specifically, pressing section 90 can be elastically deformed such that when an external force is applied downward by a worker (operator) pressing the pressing section 90 from the upper side to the lower side through opening portion 42a, distal end portion 90a is deflected downward, and when the application of the external force is released by the release of the pressing, distal end portion 90a returns to the original state. The elastic deformation of pressing section 90 presses tongue portion 46 so that distal end portion 46a thereof can move between first height position H1 at which distal end portion 46a of tongue portion 46 can enter between base tape 82 and cover tape 83 of carrier tape 80 and second height position H2 higher than first height position H1.

Pressing section 90 has a predetermined length from a base on the main body portion side of guide section 41 to a distal end of distal end portion 90a. The predetermined length is set to a length by which distal end portion 46a of tongue portion 46 can move in an up-down direction by a difference between first height position H1 and second height position H2. Pressing section 90 is elastically deformed with a base on the main body portion side of guide section 41 as a fulcrum so that when an external force is applied to the upper surface of pressing section 90 from the upper side to the lower side, the external force is transmitted to tongue portion 46 as the pressing force, and distal end portion 46a of tongue portion 46 is located at first height position H1, and when the application of the external force is released, distal end portion 46a of tongue portion 46 is located at second height position H2.

Pressing section 90 has a predetermined width in the tape width direction of carrier tape 80. The predetermined width is set so as to be smaller than the tape width of carrier tape 80 and thus the width of tongue portion 46. Pressing section 90 is placed so as to coincide with tongue portion 46 in the width direction of carrier tape 80. Pressing section 90 is placed so as to include at least a portion facing opposing part 46b of tongue portion 46 in the up-down direction. Pressing section 90 is formed such that a lower surface facing an upper surface of tongue portion 46 is horizontal without a step.

Figure 10:
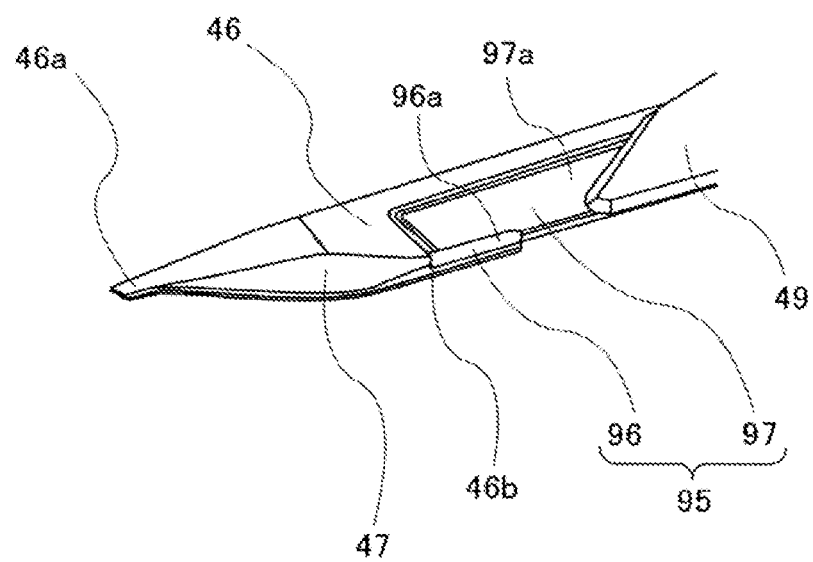
FIG. 10 is a perspective view of a tongue portion provided in the tape guide according to one embodiment.

Tape guide 40 also has stepped portion 95. Stepped portion 95 is a portion where a step is formed. Stepped portion 95 is provided on a facing surface on which tongue portion 46 and pressing section 90 face each other. Specifically, stepped portion 95 is provided on the upper surface of tongue portion 46 that faces the lower surface of pressing section 90. As illustrated in FIG. 10, stepped portion 95 has protruding portion 96 and recessed portion 97. Protruding portion 96 has upper surface 96a formed in a planar shape. Recessed portion 97 has upper surface 97a formed in a planar shape. Upper surface 96a of protruding portion 96 is located above upper surface 97a of recessed portion 97.

Upper surface 96a of protruding portion 96 forms a contact surface on which contact with the lower surface of pressing section 90 occurs when a pressing force is applied from pressing section 90 to tongue portion 46. Meanwhile, upper surface 97a of recessed portion 97 does not form the contact surface on which the contact with the lower surface of pressing section 90 occurs even when the pressing force is applied pressing section 90 to tongue portion 46. In this structure, when pressing section 90 is pressed from the upper side to the lower side, a portion of the lower surface of pressing section 90 facing upper surface 96a of protruding portion 96 is in contact with upper surface 96a of protruding portion 96, whereas a portion of the lower surface of pressing section 90 facing upper surface 97a of recessed portion 97 is in no contact with the upper surface of tongue portion 46. Therefore, the application of the pressing force from pressing section 90 to tongue portion 46 is performed via protruding portion 96 by which tongue portion 46 and pressing section 90 abut on each other.

Upper surface 96a of protruding portion 96 forming the contact surface with pressing section 90 in tongue portion 46 is provided at a position corresponding to opposing part 46b of lower surface of tongue portion 46 that abuts on stopper section 48. The position at which upper surface 96a of protruding portion 96 is provided is in the upper region with respect to the location of opposing part 46b.

It should be noted that upper surface 96a of protruding portion 96 is not limited to being located in a region having a tubular shape obtained by projecting an outer edge of opposing part 46b abutting on stopper section 48 on the lower surface of tongue portion 46 upward, but may be located in a region in the tape width direction obtained by projecting the outer edge of opposing part 46b in the tape width direction upward. That is, upper surface 96a of protruding portion 96 may not be located in the region in tape conveyance direction X obtained by projecting an outer edge of opposing part 46b in tape conveyance direction X upward, or may be deviated in tape conveyance direction X with respect to the location of opposing part 46b.

This is because, since tongue portion 46 extends from guide section 41 in tape conveyance direction X and distal end portion 46a thereof is deflected in the up-down direction and elastically deformed, when the position of upper surface 96a of protruding portion 96 and the position of opposing part 46b overlap each other in the tape width direction, the pressing force for moving tongue portion 46 downward can be caused to act on the lower surface of tongue portion 46 at a position matched with opposing part 46*b*, which is the abutment portion where tongue portion 46 abuts on stopper section 48.

Tape guide 40 also includes folding section 49. After one end portion of cover tape 83 in the width direction is peeled from base tape 82, folding section 49 is a section for raising and folding an end portion in the tape width direction on the peeling side of cover tape 83. Folding section 49 is placed on the downstream side of tongue portion 46 in tape conveyance direction X, and is placed on the upstream side of component supply position P in tape conveyance direction X. Folding section 49 is formed in a plate shape, and is formed so as to increase in width from the upstream side in tape conveyance direction X to downstream side in tape conveyance direction X. Folding section 49 is formed and placed so as to close a part of opening portion 42*a*.

Tape feeding section 50 is a section for conveying carrier tape 80 drawn from tape reel 81. As illustrated in FIG. 1, tape feeding section 50 includes manual sprocket 51, manual handle 52, automatic sprocket 53, and a motor (not illustrated).

Manual sprocket 51 is a rotating body supported so as to be rotatable with respect to cassette case 10. Manual sprocket 51 is formed in a substantially disk shape. Manual sprocket 51 is placed on an upstream side (specifically, an inclined portion of which a position gradually increases from the upstream side to the downstream side in tape conveyance direction X in tape conveyance path 30) in tape conveyance direction X with respect to tongue portion 46 of tape guide 40 in tape conveyance path 30. Manual sprocket 51 rotates about a horizontal supporting shaft provided below tape conveyance path 30 with respect to cassette case 10.

Manual sprocket 51 has external teeth protruding radially outward. External teeth of manual sprocket 51 are provided in plural at angular intervals corresponding to the intervals of feed holes 86 of carrier tape 80. The external teeth protrude upward through the through hole of tape conveyance path 30 when located in the vicinity of the uppermost end of manual sprocket 51. The external teeth protruding upward from tape conveyance path 30 engage with feed hole 86 of carrier tape 80.

Manual handle 52 is an operation handle capable of allowing the worker to rotate manual sprocket 51. Manual handle 52 is integrally provided with manual sprocket 51. When manual handle 52 is operated by the worker, manual sprocket 51 rotates. When manual sprocket 51 rotates and the external teeth of manual sprocket 51 engage with feed hole 86 of carrier tape 80 on tape conveyance path 30, carrier tape 80 is conveyed in tape conveyance direction X along tape conveyance path 30.

Automatic sprocket 53 is a rotating body supported so as to be rotatable with respect to cassette case 10. Automatic sprocket 53 is formed in a substantially disk shape. Automatic sprocket 53 is placed on the downstream side (specifically, in the vicinity of component supply position P) of tongue portion 46 of tape guide 40 in tape conveyance path 30 in tape conveyance direction X. Automatic sprocket 53 rotates about a horizontal supporting shaft provided below tape conveyance path 30 with respect to cassette case 10.

Automatic sprocket 53 has external teeth protruding radially outward. The external teeth of automatic sprocket 53 are provided in plural at angular intervals corresponding to the intervals of feed holes 86 of carrier tape 80. The external teeth protrude upward through the through hole of tape conveyance path 30 when located in the vicinity of the uppermost end of automatic sprocket 53. The external teeth protruding upward from tape conveyance path 30 engage with feed hole 86 of carrier tape 80.

Automatic sprocket 53 engages with an output shaft of the motor via a gear. Automatic sprocket 53 decelerates in synchronization with rotational driving of the motor. The motor is intermittently driven so as to rotate by a predetermined angle per driving. When automatic sprocket 53 is intermittently driven by the motor to rotate in a state in which the external teeth thereof engage with feed hole 86 of carrier tape 80 on tape conveyance path 30, carrier tape 80 is pitch-fed in tape conveyance direction X along tape conveyance path 30 and is conveyed.

Tape discharge passage 60 is provided in cassette case 10. Tape discharge passage 60 is placed and formed so as to extend from the upper portion to the lower portion on the front side (that is, the downstream side in tape conveyance direction X) in cassette case 10. After electronic component 2 is removed from base tape 82 at component supply position P, carrier tape 80 is guided to tape discharge passage 60 in a state where base tape 82 and cover tape 83 adhere to each other at the other end portion in the width direction, and is discharged from the lower portion of cassette case 10 to the outside.

2. Method for Using Tape Guide and Effects

Tape guide 40 is in a state in which distal end portion 46*a* of tongue portion 46 is located at second height position H2 as illustrated in FIG. 12 when the worker does not apply external force F downward with respect to tongue portion 46 of component exposing section 45.

As illustrated in FIG. 11, before distal end of carrier tape 80 in tape conveyance direction X reaches tongue portion 46 of tape guide 40, that is, before distal end portion 46*a* of tongue portion 46 of tape guide 40 enters between base tape 82 and cover tape 83 at distal end of carrier tape 80 in tape conveyance direction X, the worker presses tongue portion 46 downward with external force F through opening portion 42*a* of tape guide 40 and moves tongue portion 46 downward so that distal end portion 46*a* of tongue portion 46 is located at first height position H1. The downward movement of tongue portion 46 is performed until opposing part 46*b* of tongue portion 46 abuts on stopper section 48. Until distal end portion 46*a* of tongue portion 46 of tape guide 40 enters between base tape 82 and cover tape 83 at the distal end of carrier tape 80 in tape conveyance direction X, the state in which distal end portion 46*a* is located at first height position H1 is maintained.

When carrier tape 80 is conveyed in tape conveyance direction X by the worker operating manual handle 52 to rotate manual sprocket 51 in the state in which distal end portion 46*a* of tongue portion 46 of tape guide 40 is located at first height position H1, distal end portion 46*a* of tongue portion 46 enters between base tape 82 and cover tape 83 at the distal end of carrier tape 80 in tape conveyance direction X. As described above, first height position H1 is the height position at which distal end portion 46*a* of tongue portion 46 can enter between base tape 82 and cover tape 83. Therefore, distal end portion 46*a* of tongue portion 46 can reliably and appropriately enter between base tape 82 and cover tape 83 at the distal end of carrier tape 80 in tape conveyance direction X.

After distal end portion 46*a* of tongue portion 46 of tape guide 40 enters between base tape 82 and cover tape 83 at the distal end of carrier tape 80 in tape conveyance direction X, the worker releases the downward pressing of tongue portion 46. When the pressing is released, as illustrated in FIG. 12, since the application of the external force to tongue portion 46 is released, tongue portion 46 is elastically deformed to move upward so that the height of distal end portion 46a returns to second height position H2.

When carrier tape 80 is conveyed in tape conveyance direction X by the rotation of manual sprocket 51 by the manual operation or the rotation of automatic sprocket 53 by the motor in a state in which distal end portion 46a of tongue portion 46 of tape guide 40 is located at second height position H2, tongue portion 46 (specifically, blade portion 47) is inserted between base tape 82 and cover tape 83 at one end portion in the tape width direction to which base tape 82 and cover tape 83 adhere while the state in which tongue portion 46 is inserted between base tape 82 and cover tape 83 is maintained. Accordingly, even when distal end portion 46a of tongue portion 46 moves upward to second height position H2 by elastic deformation, cover tape 83 can be peeled from base tape 82 using blade portion 47 to expose electronic component 2 in component storage section 84 of base tape 82.

Figure 15:
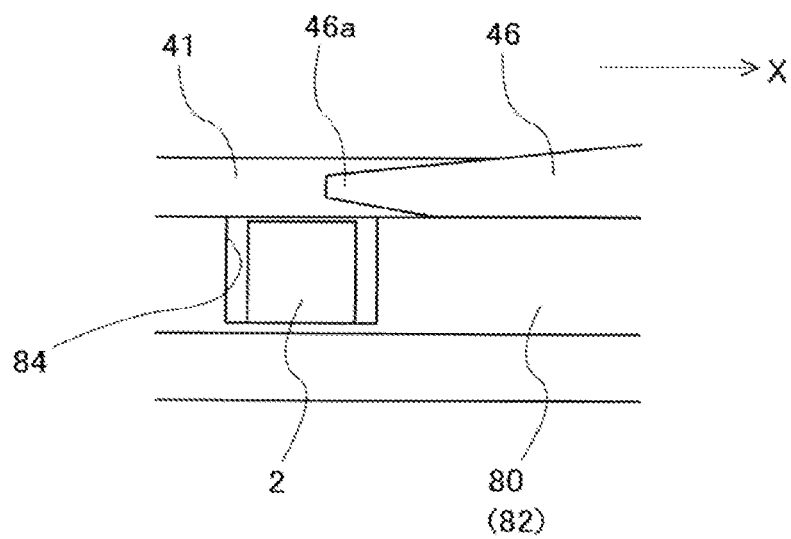
FIG. 15 is a view illustrating a positional relationship between the tongue portion and an electronic component in the carrier tape in the tape guide according to on embodiment.

Distal end portion 46a of tongue portion 46 of tape guide 40 is located at first height position H1 before carrier tape 80 enters between base tape 82 and cover tape 83, and is located at second height position H2 after the entry. As described above, second height position H2 is set to a position higher than first height position H1. Therefore, as compared with a structure in which the position of distal end portion 46a of tongue portion 46 is maintained at first height position H1 even after distal end portion 46a enters between base tape 82 and cover tape 83 of carrier tape 80, since the positional difference in the up-down direction between distal end portion 46a of tongue portion 46 and electronic component 2 in component storage section 84 of base tape 82 as illustrated in FIG. 15 can increase after distal end portion 46a of tongue portion 46 enters between base tape 82 and cover tape 83 of carrier tape 80, it is possible to prevent electronic component 2 from coming into contact with corner portion of distal end portion 46a of tongue portion 46.

In particular, when second height position H2 is set to be higher than first height position H1 and higher than the upper surface of base tape 82 of carrier tape 80, since the position of distal end portion 46a of tongue portion 46 is maintained at a position higher than the upper surface of base tape 82 after tongue portion 46 enters between base tape 82 and cover tape 83 at the distal end of carrier tape 80 in the tape conveyance direction X, it is possible to reliably prevent electronic component 2 in component storage section 84 of base tape 82 from coming into contact with the corner portion of distal end portion 46a of tongue portion 46.

Accordingly, with tape guide 40, it is possible to prevent electronic component 2 in component storage section 84 of base tape 82 from coming into contact with distal end portion 46a of tongue portion 46 after the entry thereof, while appropriately causing tongue portion 46 of component exposing section 45 to enter between base tape 82 and cover tape 83 at the distal end of carrier tape 80 in tape conveyance direction X. Accordingly, after cover tape 83 is peeled from base tape 82 to expose electronic component 2 in component storage section 84 of base tape 82, it is possible to prevent electronic component 2 from being scratched due to contact with tongue portion 46.

In tape guide 40, even when tongue portion 46 of component exposing section 45 is pressed downward, opposing part 46b of tongue portion 46 abuts on stopper section 48, and thus, the movement of distal end portion 46a of tongue portion 46 to a height lower than first height position H1 is restrained. Accordingly, even when the force with which the worker presses tongue portion 46 downward is large, distal end portion 46a of tongue portion 46 can be reliably located at first height position H1 when distal end portion 46a enters between base tape 82 and cover tape 83 at the distal end of carrier tape 80 in tape conveyance direction X, and thus, the entry can be reliably performed.

Stopper section 48 is the upper surface of side wall portion 43 of guide section 41. Therefore, it is possible to restrain the position movement of distal end portion 46a of tongue portion 46 to a height lower than first height position H1 with a simple structure without preparing a component separate from guide section 41.

In tape guide 40, distal end portion 46a of tongue portion 46 of component exposing section 45 is tapered so that the lower surface thereof is inclined downward from the upstream side in tape conveyance direction X to the downstream side in tape conveyance direction X. Therefore, as compared with a structure in which the lower surface of distal end portion 46a of tongue portion 46 is formed horizontally from the upstream side in tape conveyance direction X to the downstream side in tape conveyance direction X, since electronic component 2 in component storage section 84 of base tape 82 is less likely to come into contact the corner portion of distal end portion 46a of tongue portion 46, it is possible to reliably prevent electronic component 2 from being scratched due to the contact with the corner portion of distal end portion 46a.

In the structure of tape guide 40, when the worker presses pressing section 90 from the upper side to the lower side, the pressing force applied from pressing section 90 to tongue portion 46 to move tongue portion 46 downward is performed via protruding portion 96 of tongue portion 46. When this pressing force acts, tongue portion 46 is elastically deformed by the pressing force applied to protruding portion 96. As described above, the position of protruding portion 96 is in the upper region with respect to the location of opposing part 46b on the lower surface of tongue portion 46 that abuts on stopper section 48.

With this structure, since the pressing force applied to tongue portion 46 to move tongue portion 46 downward during the pressing operation of the worker is acted on the lower surface of tongue portion 46 at a position matched with the abutment portion where tongue portion 46 abuts on stopper section 48, it is possible to prevent tongue portion 46 from being twisted until the lower surface abuts on stopper section 48, or from being further twisted after the abutment on stopper section 48. Therefore, distal end portion 46a of tongue portion 46 can be elastically deformed (that is, moved up and down) while maintaining an appropriate posture. Therefore, the height of distal end portion 46a of tongue portion 46 caused by the pressing operation of the worker can be stably held at a desired height position (specifically, first height position H1), and thus, distal end portion 46a of tongue portion 46 can reliably enter between base tape 82 and cover tape 83.

3. Modifications

In the above embodiment, electronic component 2 is exposed by inserting blade portion 47 of component exposing section 45 into the adhesive portion between base tape 82 and cover tape 83 so that cover tape 83 is partially peeled from base tape 82 from the state in which cover tape 83 adheres to base tape 82 and electronic component 2 in component storage section 84 is covered with cover tape 83.

However, the present disclosure is not limited to this configuration, and may be applied to a configuration in which cover tape 83 is opened without peeling cover tape 83 from base tape 82 at the adhesive portion in order to expose electronic component 2 in component storage section 84. For example, instead of peeling cover tape 83 from base tape 82 by blade portion 47, cover tape 83 may be divided into two in the tape width direction by a cutter, so that tongue portion 46 is inserted between base tape 82 and cover tape 83 after the division into two.

In the above embodiment, in order to move tongue portion 46 of component exposing section 45 of tape guide 40 in the up-down direction, tongue portion 46 has a length such that the position of distal end portion 46a can move in the up-down direction by a difference between first height position H1 and second height position H2 from the fixed portion fixed to guide section 41 to distal end portion 46a, and thus, tongue portion 46 itself is elastically deformed.

Figure 16:
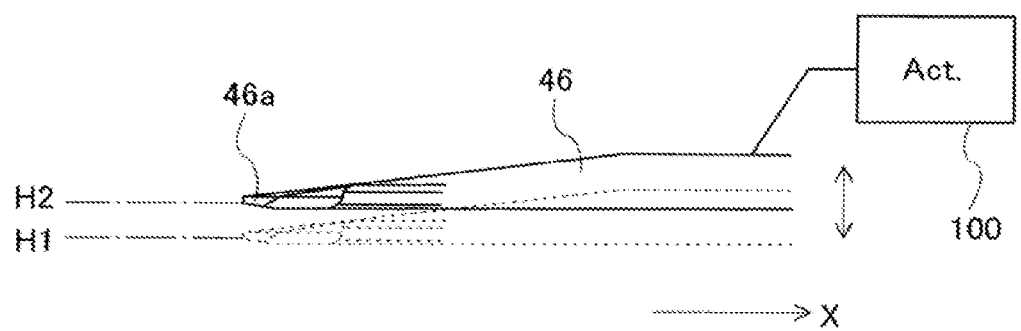
FIG. 16 is a configuration view of a tape guide according to one modification.

However, the present disclosure is not limited to this, and tape guide 40 may be provided with an up-down position changing mechanism for moving tongue portion 46 in the up-down direction. For example, as illustrated in FIG. 16, tongue portion 46 may be moved up and down with respect to guide section 41 using a force generated by actuator 100 such as a motor. In addition, tongue portion 46 may be moved up and down with respect to guide section 41 using, for example, a biasing force of a spring generated in accordance with an operation of the worker. In this modification, tongue portion 46 may not have a length elastically deformable from the fixed portion fixed to guide section 41 to distal end portion 46a.

In the above embodiment, protruding portion 96 of stepped portion 95 is formed so as to have upper surface 96a formed in a planar shape, and upper surface 96a is placed so as to be located in an upper region with respect to the location of opposing part 46b. However, the present disclosure is not limited to this, and protruding portion 96 may be formed so as to protrude in a pin shape, and may be placed such that a distal end of the pin is located in an upper region with respect to the location of opposing part 46b.

In the above embodiment, tape guide 40 includes pressing section 90 and stepped portion 95, pressing section 90 is placed above tongue portion 46 and is formed in a flat plate shape, and stepped portion 95 is provided on the upper surface of tongue portion 46 facing the lower surface of pressing section 90. However, the present disclosure is not limited to this configuration, and may be applied to a tape guide in which tongue portion 46 is placed below pressing section 90 so that the upper surface of tongue portion 46 is formed in a planar shape and stepped portion 95 is provided on the lower surface of pressing section 90 facing the upper surface of tongue portion 46. Also in this configuration, it is possible to obtain the same advantages as those of the above-described modification.

Further, in the above embodiment, component supply device 1 is a cassette type tape feeder in which the main body is covered with cassette case 10. However, the present disclosure is not limited to this, and component supply device 1 may be applied to a tape feeder other than the cassette type tape feeder.

It should be noted that the present disclosure is not limited to the above-described embodiments and modifications, and various modifications can be made without departing from a gist of the present disclosure.

REFERENCE SIGNS LIST

1: component supply device, 2: electronic component, 10: cassette case, 20: tape loading section, 30: tape conveyance path, 40: tape guide, 41: guide section, 42: upper wall portion, 42a: opening portion, 43: side wall portion, 45: component exposing section, 46: tongue portion, 46a: distal end portion, 46b: opposing part, 47: blade portion, 48: stopper section, 50: tape feeding section, 80: carrier tape, 81: tape reel, 82: base tape, 83: cover tape, 84: component storage section, 86: feed hole, 90: pressing section, 95: stepped portion, 96: protruding portion, 97: recessed portion, P: component supply position, H1: first height position, H2: second height position

The invention claimed is:

1. A tape guide comprising:
a guide section extending along a conveyance direction in which a carrier tape is conveyed and configured to guide the carrier tape, the carrier tape including a base tape provided with a component storage section for storing an electronic component and a cover tape provided on a surface of the base tape to close the component storage section;
a component exposing section configured to open the cover tape to expose the electronic component in the component storage section during conveyance of the carrier tape guided by the guide section;
a tongue portion provided on the component exposing section and configured such that a distal end portion is movable between a first height position at which the distal end portion enters between the base tape and the cover tape and a second height position higher than the first height position;
a stopper section configured to restrain the distal end portion from moving to a height lower than the first height position;
a pressing section placed above the tongue portion to apply a pressing force to the tongue portion to cause the tongue portion to move downward; and
a stepped portion provided on a facing surface on which the tongue portion and the pressing section face each other and including a step formed thereon,
wherein the stepped portion includes
a protruding portion having a contact portion in which contact is generated between the tongue portion and the pressing section when the pressing force is applied, and
a recessed portion in which the contact is not generated even when the pressing force is applied, and
the contact portion is located in an upper region of a lower surface of the tongue portion with respect to an abutment portion at which the tongue portion abuts on the stopper section.

2. The tape guide according to claim 1,
wherein the second height position is higher than the first height position and higher than an upper surface of the base tape.

3. The tape guide according to claim 1,
wherein the tongue portion elastically deforms so that the distal end portion is located at the first height position when the pressing force is applied to the tongue portion from an upper side to a lower side, and the distal end portion is located at the second height position when the application of the pressing force is released.

4. The tape guide according to claim 1, further comprising an up-down position changing mechanism configured to move the tongue portion up and down.

5. A component supply device comprising:
the tape guide according to claim 1; and
a tape feeding section configured to supply the electronic component in the component storage section to a component supply position in a state in which the electronic component is exposed by conveying the carrier tape along the guide section.

* * * * *